US012613467B2

(12) United States Patent
Park et al.

(10) Patent No.: US 12,613,467 B2
(45) Date of Patent: Apr. 28, 2026

(54) PHOTOSENSITIVE POLYMER, PHOTORESIST COMPOSITION INCLUDING THE SAME, AND METHOD OF FABRICATING SEMICONDUCTOR DEVICE

(71) Applicant: Samsung Electronics Co., Ltd., Suwon-si (KR)

(72) Inventors: Sung Hwan Park, Suwon-si (KR); Juhyeon Park, Hwaseong-si (KR); Hyunwoo Kim, Seoul (KR); Suk Koo Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 621 days.

(21) Appl. No.: 18/154,184

(22) Filed: Jan. 13, 2023

(65) Prior Publication Data

US 2023/0296983 A1 Sep. 21, 2023

(30) Foreign Application Priority Data

Mar. 16, 2022 (KR) ........................ 10-2022-0032948

(51) Int. Cl.

*G03F 7/039* (2006.01)
*G03F 7/004* (2006.01)
*G03F 7/038* (2006.01)

(52) U.S. Cl.

CPC ............ *G03F 7/0397* (2013.01); *G03F 7/004* (2013.01); *G03F 7/0382* (2013.01); *G03F 7/0392* (2013.01); *C08F 2800/10* (2013.01)

(58) Field of Classification Search

None

See application file for complete search history.

(56) References Cited

U.S. PATENT DOCUMENTS 5,204,217 A * 4/1993 Aoai ...................... G03F 7/0045 430/326
7,569,325 B2 8/2009 Lee et al.

(Continued)

FOREIGN PATENT DOCUMENTS

KR 101267262 B1 5/2013
KR 102205849 B1 1/2021

OTHER PUBLICATIONS

Sequential post-polymerization modification reactions of poly(pentafluorophenyl 4-vinylbenzenesulfonate (Year: 2014).*

(Continued)

*Primary Examiner* — Mark F. Huff
*Assistant Examiner* — Kevin J Drummey
(74) *Attorney, Agent, or Firm* — Fish & Richardson P.C.

(57) ABSTRACT

An extreme ultraviolet (EUV) photosensitive polymer includes a first repeating unit represented by Chemical Formula 1.

[Chemical Formula 1]

(Continued)

(in Chemical Formula 1, $R^1$ is a C1 to C10 alkyl group, a C1 to C10 haloalkyl group, a C6 to C18 aryl group, a haloaryl group, a C7 to C18 arylalkyl group, a C7 to C18 alkylaryl group, or a C6 to C18 haloaryl group, and $R^2$ is a direct bond, a C1 to C10 alkylene group, a C2 to C10 alkenyl group, a C2 to C10 alkynyl group, a C6 to C18 aryl group, a C7 to C18 arylalkyl group, or a C7 to C18 alkylaryl group).

14 Claims, 7 Drawing Sheets

(56) References Cited

U.S. PATENT DOCUMENTS

| | | | | | |
|---|---|---|---|---|---|
| 8,268,531 | B2 | 9/2012 | Ober et al. | | |
| 8,703,384 | B2 | 4/2014 | Kobayashi et al. | | |
| 9,217,919 | B2 | 12/2015 | Takahashi et al. | | |
| 9,244,345 | B1 | 1/2016 | Ishimaru et al. | | |
| 10,831,102 | B2 | 11/2020 | De Silva et al. | | |
| 2003/0232277 | A1* | 12/2003 | Sasaki | G03F 7/0397 | 430/176 |
| 2012/0308938 | A1* | 12/2012 | Furukawa | G03F 7/2041 | 430/325 |
| 2015/0086925 | A1* | 3/2015 | Ayothi | G03F 7/325 | 430/285.1 |

OTHER PUBLICATIONS

E. Torti et al., "Aryl sulfonates as initiators for EUV lithography. Applications on epoxy-based hybrid materials," ChemPhotoChem, Wiley-VCH, Feb. 8, 2018.

* cited by examiner

PHOTOSENSITIVE POLYMER, PHOTORESIST COMPOSITION INCLUDING THE SAME, AND METHOD OF FABRICATING SEMICONDUCTOR DEVICE

CROSS-REFERENCE TO RELATED APPLICATION

This application is based on and claims priority under 35 U.S.C. § 119 to Korean Patent Application No. 10-2022-0032948, filed on Mar. 16, 2022, in the Korean Intellectual Property Office, the disclosure of which is incorporated by reference herein in its entirety.

BACKGROUND

The inventive concepts relate to a photosensitive polymer, a photoresist composition including the photosensitive polymer, and a method of fabricating a semiconductor device, and more particularly, to a photosensitive polymer, which may more precisely control the sensitivity of a photoresist film due to improved line edge roughness (LER) and/or line width roughness (LWR) and an increased range of an amount of an ionic photoacid generator (PAG) capable of being added without aggregation, a photoresist composition including the photosensitive polymer, and a method of fabricating a semiconductor device.

Due to the advancement of electronics technology, semiconductor devices have been rapidly down-scaled in recent years. Therefore, there is a demand for a photolithography process that is advantageous in implementing fine patterns. In particular, there is a demand to develop a technique capable of improving properties, such as LER and LWR, in a photolithography process of fabricating an integrated circuit device.

SUMMARY

The inventive concepts provide a photosensitive polymer, which may more precisely control the required sensitivity of a photoresist film due to improved line edge roughness (LER) and/or line width roughness (LWR) and an increased range of an amount of an ionic photoacid generator (PAG) capable of being added without aggregation.

The inventive concepts also provide a photoresist composition, which may more precisely control the required sensitivity of a photoresist film due to improved LER and/or LWR and an increased range of an amount of an ionic PAG capable of being added without aggregation.

The inventive concepts also provide a method of fabricating a semiconductor device, the method allowing the required sensitivity of a photoresist film to be more precisely controlled due to improved LER and/or LWR and an increased range of an amount of an ionic PAG capable of being added without aggregation.

According to an aspect of the inventive concepts, there is provided an extreme ultraviolet (EUV) photosensitive polymer including a first repeating unit represented by Chemical Formula 1.

[Chemical Formula 1]

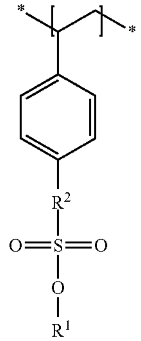

Wherein in Chemical Formula 1, $R^1$ is a C1 to C10 alkyl group, a C1 to C10 haloalkyl group, a C6 to C18 aryl group, a haloaryl group, a C7 to C18 arylalkyl group, a C7 to C18 alkylaryl group, or a C6 to C18 haloaryl group, and $R^2$ is a direct bond, a C1 to C10 alkylene group, a C1 to C10 haloalkylene group, a C2 to C10 alkenyl group, a C2 to C10 alkynyl group, a C6 to C18 aryl group, a C7 to C18 arylalkyl group, or a C7 to C18 alkylaryl group.

According to another aspect of the inventive concepts, there is provided a photoresist composition including: a photosensitive polymer; and a solvent, wherein the photosensitive polymer includes a first repeating unit represented by Chemical Formula 1.

According to yet another aspect of the inventive concepts, there is provided a photoresist composition including: a photosensitive polymer; a photoacid generator (PAG); a basic quencher; and a solvent, wherein the photosensitive polymer includes a random copolymer including the first repeating unit represented by Chemical Formula 1, a second repeating unit represented by Chemical Formula 2, and a third repeating unit represented by Chemical Formula 3.

[Chemical Formula 2]

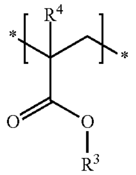

[Chemical Formula 3]

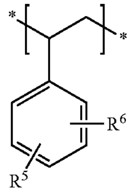

Wherein in Chemical Formulae 2 and 3, $R^3$ is an acid-labile protecting group, $R^4$ is a hydrogen atom, a C1 to C6 linear or branched alkyl group, a halogen atom, or a C1 to C6 linear or branched alkyl halide group, $R^5$ is a hydrogen atom, a hydroxyl group, a carboxyl group, a C1 to C10 alkyl group, a C3 to C12 cycloalkyl group, or a C1 to C10 alkoxy group, and $R^6$ is a hydrogen atom, a hydroxyl group, or a carboxyl group.

According to yet another aspect of the inventive concepts, there is provided a method of fabricating a semiconductor device, the method including: forming a photoresist material layer on a lower film by using a photoresist composition; irradiating a portion of the photoresist material layer with one of a KrF excimer laser (248 nm), an ArF excimer laser (193 nm), an F2 excimer laser (157 nm), or EUV light (13.5 nm); forming a photoresist by removing a portion of the exposed photoresist material layer; and processing the lower film by using the photoresist pattern, wherein the photoresist composition includes a photosensitive polymer, a photoacid generator (PAG), and a solvent, and the photosensitive polymer includes a first repeating unit represented by Chemical Formula 1.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
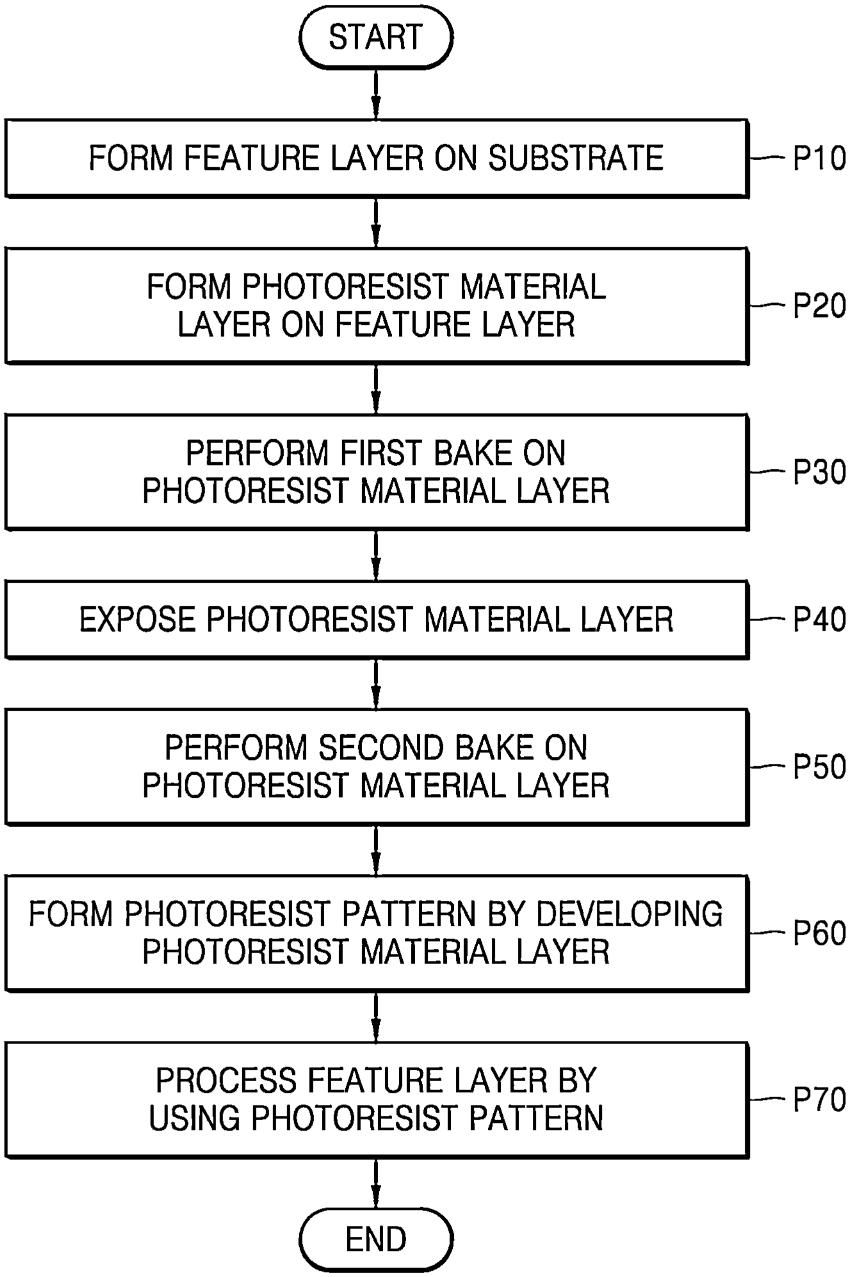
FIG. 1 is a flowchart illustrating a method of fabricating an integrated circuit device, according to embodiments of the inventive concepts.

Hereinafter, embodiments of the inventive concepts will be described in detail with reference to the accompanying drawings. Like components are denoted by like reference numerals throughout the specification, and repeated descriptions thereof are omitted.

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

A photoresist composition according to an embodiment of the inventive concepts include a photosensitive polymer and a solvent.

Photosensitive Polymer

The photosensitive polymer may be a polymer capable of undergoing a photochemical reaction, in response to irradiation by a KrF excimer laser (248 nm), an ArF excimer laser (193 nm), an F2 excimer laser (157 nm), an extreme ultraviolet (EUV) light (13.5 nm) and/or the like, and in particular, in response to the irradiation by EUV light. In some embodiments, the photosensitive polymer may have an increased solubility in a developer due to the photochemical reaction. In the following formulae, "*" represents a binding site.

The photosensitive polymer includes a first repeating unit represented by Chemical Formula 1.

[Chemical Formula 1]

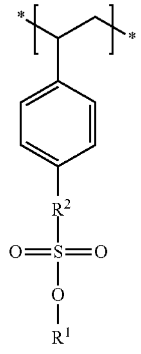

In Chemical Formula 1, $R^1$ is a C1 to C10 alkyl group, a C1 to C10 haloalkyl group, a C6 to C18 aryl group, a haloaryl group, a C7 to C18 arylalkyl group, a C7 to C18 alkylaryl group, or a C6 to C18 haloaryl group, and $R^2$ is a direct bond, a C1 to C10 alkylene group, a C1 to C10 haloalkylene group, a C2 to C10 alkenyl group, a C2 to C10 alkynyl group, a C6 to C18 aryl group, a C7 to C18 arylalkyl group, or a C7 to C18 alkylaryl group.

As used herein, the term "direct bond (or direct bonding)" means that the aryl group in Chemical Formula 1 is directly bonded to the sulfur atom of a sulfonate group.

In some embodiments, $R^1$ may be, for example, a functional group that may be dissociated from the $-SO_3$ group in Chemical Formula 1 by the irradiation of EUV light having a wavelength of 13.5 nm. For example, in some embodiments, $R^1$ may be a methyl group, a monofluoromethyl group, a monochloromethyl group, a difluoromethyl group, a dichloromethyl group, a trifluoromethyl group, a trichloromethyl group, an ethyl group, a monofluoroethyl group, a monochloroethyl group, a difluoroethyl group, a dichloroethyl group, a trifluoroethyl group, a trichloroethyl group, a monofluorophenyl group, a monochlorophenyl group, a difluorophenyl group, a dichlorophenyl group, a trifluorophenyl group, a trichlorophenyl group, a tetrafluorophenyl group, a tetrachlorophenyl group, a perfluorophenyl group, or a perchlorophenyl group.

In some embodiments, $R^2$ may be a direct bond, a methylene group, or a C6 to C18 aryl group.

In some embodiments, the first repeating unit may be represented by one of Chemical Formulae 1-1 to 1-8.

(1-1)

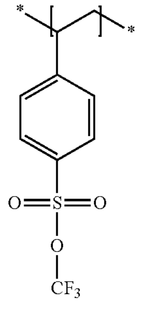

-continued (1-2)

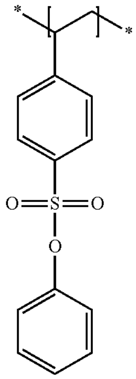

(1-3)

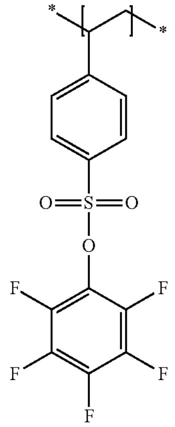

(1-4)

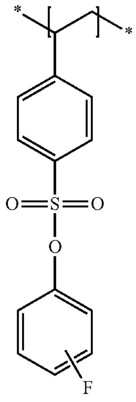

(1-5)

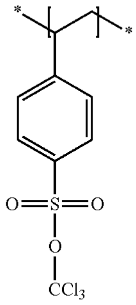

-continued (1-6)

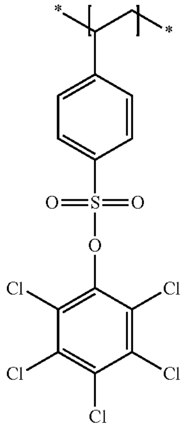

(1-7)

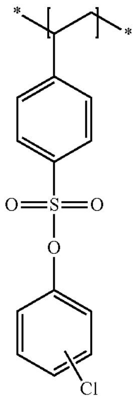

(1-8)

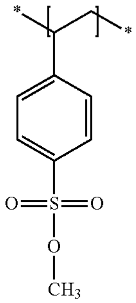

In some embodiments, the photosensitive polymer may further include a second repeating unit represented by Chemical Formula 2. Here, the second repeating unit moiety may be referred to as an acrylic resin moiety.

[Chemical Formula 2]

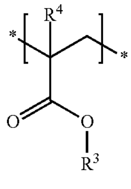

In Chemical Formula 2, $R^3$ is an acid-labile protecting group, and $R^4$ is a hydrogen atom, a C1 to C6 linear or branched alkyl group, a halogen atom, or a C1 to C6 linear or branched alkyl halide group.

The acid-labile protecting group may be, for example, a linear, branched, or cyclic alkyl group having 1 to 6 carbon atoms, a vinyloxyethyl group, a tetrahydropyranyl group, a tetrafuranyl group, a trialkylsilyl group, an isonorbornyl group, a 2-methyl-2-adamantyl group, a 2-ethyl-2-adamantyl group, a 3-tetrahydrofuranyl group, a 3-oxocyclohexyl group, a γ-butyllactone-3-yl group, mevaloniclactone, a γ-butyrolactone-2-yl group, a 3-methyl-γ-butyrolactone-3-yl group, a 2-tetrahydropyranyl group, a 2-tetrahydrofuranyl group, a 2,3-propylenecarbonate-1-yl group, a 1-methoxyethyl group, a 1-ethoxyethyl group, a 1-(2-methoxyethoxy)ethyl group, a 1-(2-acetoxyethoxy)ethyl group, a t-buthoxycarbonylmethyl group, a methoxymethyl group, an ethoxymethyl group, a trimethoxysilyl group, a triethoxysilyl group, a methoxyethyl group, an ethoxyethyl group, an n-propoxyethyl group, an isopropoxyethyl group, an n-butoxyethyl group, an isobutoxyethyl group, a tert-butoxyethyl group, a cyclohexyloxyethyl group, a methoxypropyl group, an ethoxypropyl group, a 1-methoxy-1-methyl-ethyl group, a 1-ethoxy-1-methylethyl group, a tert-butoxycarbonyl (t-BOC) group, or a tert-butoxycarbonylmethyl group. The linear or branched alkyl group may include, for example, a methyl group, an ethyl group, a propyl group, an isopropyl group, an n-butyl group, an isobutyl group, a tert-butyl group, a pentyl group, an isopentyl group, a neopentyl group, and/or the like. In addition, the cyclic alkyl group may include a cyclopentyl group, a cyclohexyl group, and/or the like.

In some embodiments, the second repeating unit may include a repeating unit of a (meth)acrylate polymer. The (meth)acrylate polymer may include an aliphatic (meth)acrylate polymer, for example, polymethylmethacrylate (PMMA), poly(t-butylmethacrylate), poly(methacrylic acid), poly(norbornylmethacrylate), a binary or ternary copolymer of repeating units of (meth)acrylate polymers, a combination thereof, and/or the like.

In some embodiments, the acrylic resin moiety may further include another polymerizable compound as a repeating unit. Examples of the other polymerizable compound may include: ether linkage-containing acrylates, such as 2-methoxyethyl (meth)acrylate, 2-ethoxyethyl (meth)acrylate, methoxytriethylene glycol (meth)acrylate, 3-methoxybutyl (meth)acrylate, ethyl carbitol (meth)acrylate, phenoxypolyethylene glycol (meth)acrylate, methoxypolyethylene glycol (meth)acrylate, methoxypolypropylene glycol (meth)acrylate, and tetrahydrofurfuryl (meth)acrylate, a combination thereof, and/or the like; monocarboxylic acids, such as acrylic acid, methacrylic acid, crotonic acid, a combination thereof, and/or the like; dicarboxylic acids, such as maleic acid, fumaric acid, itaconic acid, a combination thereof, and/or the like; methacrylic acid derivatives having a carboxyl group and an ester bond (such as 2-methacryloyloxyethyl succinic acid, 2-methacryloyloxyethyl maleic acid, 2-methacryloyloxyethyl phthalic acid, and 2-methacryloyloxyethyl hexahydrophthalic acid); (meth)acrylic acid alkyl esters, such as methyl (meth)acrylate, ethyl (meth)acrylate, butyl (meth)acrylate, cyclohexyl (meth)acrylate, a combination thereof, and/or the like; (meth)acrylic acid hydroxyalkyl esters, such as 2-hydroxyethyl (meth)acrylate and 2-hydroxypropyl (meth)acrylate; (meth)acrylic acid aryl esters, such as phenyl (meth)acrylate, benzyl (meth)acrylate, a combination thereof, and/or the like; dicarboxylic acid diesters, such as diethyl maleate, dibutyl fumarate, a combination thereof, and/or the like; vinyl group-containing aromatic compounds, such as styrene, α-methylstyrene, chlorostyrene, chloromethylstyrene, vinyltoluene, hydroxystyrene, α-methylhydroxystyrene, α-ethylhydroxystyrene, a combination thereof, and/or the like; vinyl group-containing aliphatic compounds, such as vinyl acetate; conjugated diolefins, such as butadiene, isoprene, a combination thereof, and/or the like; nitrile group-containing polymerizable compounds, such as acrylonitrile, methacrylonitrile, a combination thereof, and/or the like; chlorine-containing polymerizable compounds, such as vinyl chloride, vinylidene chloride, a combination thereof, and/or the like; amide bond-containing polymerizable compounds, such as acrylamide, methacrylamide, a combination thereof, and/or the like; a combination thereof; and/or the like. However, the inventive concepts are not limited thereto.

In some embodiments, the photosensitive polymer may further include, as a sensitizing unit, a third repeating unit represented by Chemical Formula 3.

[Chemical Formula 3]

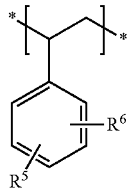

In Chemical Formula 3, $R^5$ is a hydrogen atom, a hydroxyl group, a carboxyl group, a C1 to C10 alkyl group, a C3 to C12 cycloalkyl group, or a C1 to C10 alkoxy group, and $R^6$ is a hydrogen atom, a hydroxyl group, or a carboxyl group.

For example, in some embodiments, the third repeating unit may include one or more of moieties listed in Chemical Formula 3-1.

[Chemical Formula 3-1]

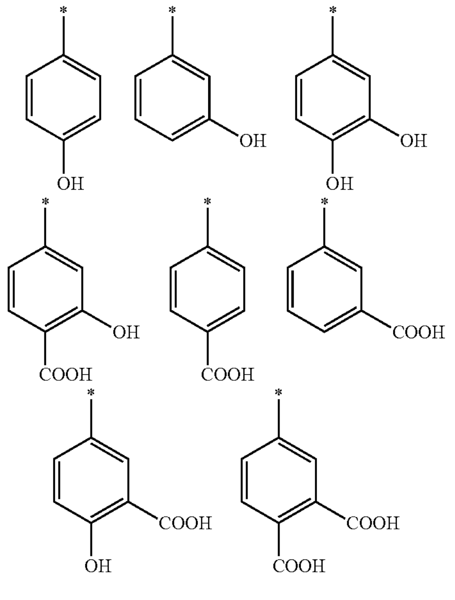

The first to third repeating units described above may be polymerized in the form of a block copolymer or a random copolymer.

In some embodiments, the number of first repeating units may be about 3% to about 40% of the number of total repeating units. In some embodiments, the proportion of the first repeating units to the total repeating units may be about 3% to about 40%, about 5% to about 38%, about 8% to about 36%, about 10% to about 34%, about 12% to about 32%, about 15% to about 30%, about 18% to about 28%, about 20% to about 27%, or in any range between these numerical values.

When the proportion of the first repeating units is too low, the effects of improving line edge roughness (LER) and line width roughness (LWR), according to the inventive concepts, may be insufficient. In contrast, when the proportion of the first repeating units is too high, the sensitivity and contrast of the photosensitive polymer may deteriorate.

The number of second repeating units (and/or the acrylic resin moiety) may be about 25% to about 65% of the number of total repeating units. In some embodiments, the proportion of the second repeating units to the total repeating units may be about 37% to about 63%, about 39% to about 61%, about 41% to about 59%, about 43% to about 57%, about 45% to about 55%, about 47% to about 53%, or in any range between these numerical values.

When the proportion of the second repeating units is too low, the contrast of the photosensitive polymer may deteriorate. When the proportion of the second repeating units is too high, the sensitivity of the photosensitive polymer may deteriorate, and/or the effects of improving LER and/or LWR may be insufficient.

The number of third repeating units may be about 20% to about 40% of the number of total repeating units. In some embodiments, the proportion of the third repeating units to the total repeating units may be about 22% to about 38%, about 24% to about 36%, about 25% to about 35%, about 26% to about 34%, about 27% to about 33%, about 28% to about 32%, or in any range between these numerical values.

When the proportion of the third repeating units is too low, the sensitivity of the photosensitive polymer may deteriorate. When the proportion of the third repeating units is too high, the contrast of the photosensitive polymer may deteriorate, and/or the effects of improving LER and/or LWR may be insufficient.

In some embodiments, the photosensitive polymer may further include a fourth repeating unit represented by Chemical Formula 4.

[Chemical Formula 4]

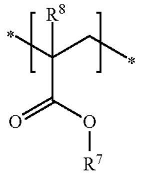

In Chemical Formula 4, $R^7$ is a C1 to C20 linear, branched, and/or cyclic saturated or unsaturated hydrocarbon group including 1 to 5 heteroatoms or including no heteroatom, and $R^8$ is a hydrogen, a C1 to C3 alkyl group, a C2 to C4 alkenyl group, a C2 to C4 alkynyl group, a C1 to C3 alkoxy group, a C6 to C10 aryl group, a C3 to C7 cycloalkyl group, or a C3 to C7 cycloalkenyl group.

In some embodiments, $R^7$ may be a C1 to C12 linear, branched, and/or cyclic saturated or unsaturated hydrocarbon group including 1 to 5 oxygen atoms, nitrogen atoms, and/or halogen atoms, or none thereof.

In some embodiments, $R^7$ in the fourth repeating unit may be one of the moieties listed in Chemical Formula 4-1.

[Chemical Formula 4-1]

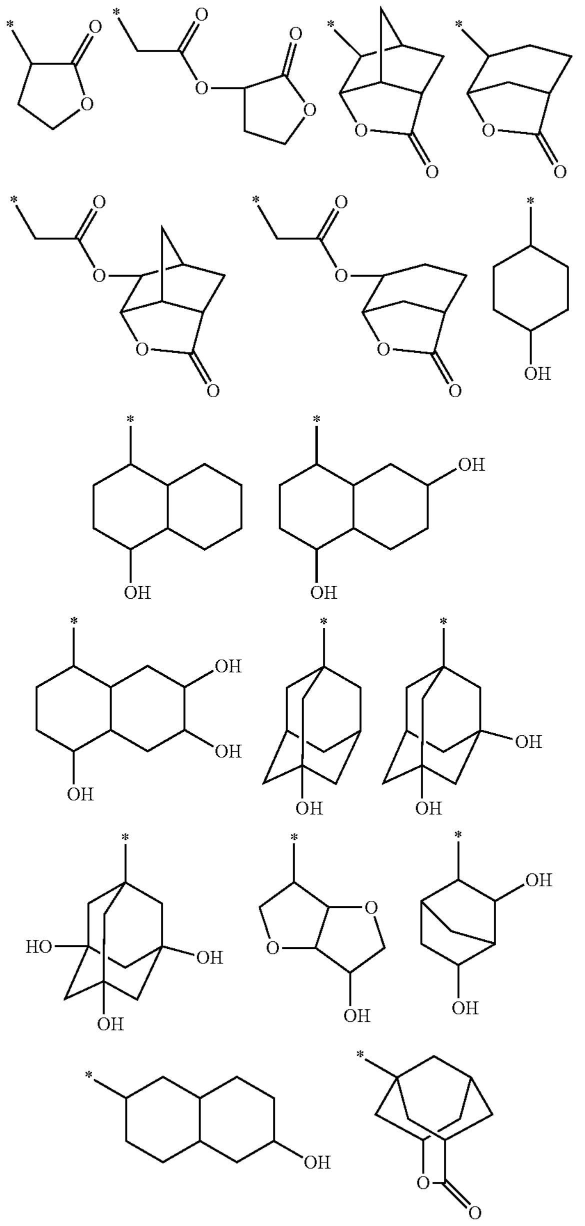

In some embodiments, the number of fourth repeating units may be about 3% to about 20% of the number of total repeating units. In some embodiments, the proportion of the fourth repeating units to the total repeating units may be about 3% to about 18%, about 4% to about 16%, about 5% to about 14%, about 6% to about 12%, about 7% to about 10%, or in any range between these numerical values.

When the proportion of the fourth repeating units is too low, the sensitivity of the photosensitive polymer may deteriorate. When the proportion of the fourth repeating units is too high, the contrast of the photosensitive polymer may deteriorate, and/or the effects of improving LER and/or LWR may be insufficient.

In some embodiments, the photosensitive polymer may be represented by Chemical Formula 5.

[Chemical Formula 5]

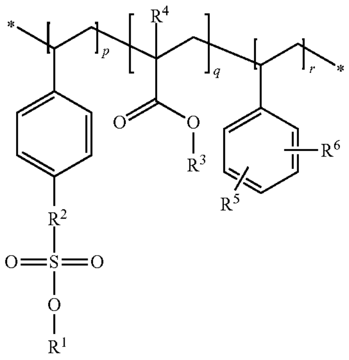

In Chemical Formula 5, p, q, and r are, respectively, the numbers of first repeating units, second repeating units (and/or acrylic resin moiety), and third repeating units, p is about 3% to about 40% of (p+q+r), q is about 35% to about 65% of (p+q+r), and r is about 20% to about 40% of (p+q+r)).

The photosensitive polymer may have a weight average molecular weight (Mw) of about 10,000 to about 600,000. In some embodiments, the photosensitive polymer may have an Mw of about 20,000 to about 400,000 and/or about 30,000 to about 300,000. In some embodiments, the Mw may be a value measured by gel permeation chromatography (GPC) by taking polystyrene as a standard.

The photosensitive polymer may have a polydispersity index (PI) of about 1 to about 3. The photosensitive polymer may be present in an amount of about 5% by weight (wt %) to about 60 wt %, based on a total weight of the photoresist composition.

Photoacid Generator (PAG)

In example embodiments, the photoresist composition may further include a PAG which generates acid upon exposure to a stimulus.

For example, the PAG may include a material having a chemical structural formula that is different from the chemical structural formula of the photo-decomposable base. In some example embodiments, the PAG may generate an acid when exposed to light of one selected from a KrF excimer laser (248 nm), an ArF excimer laser (193 nm), an F2 excimer laser (157 nm), and an extreme ultraviolet (EUV) laser (13.5 nm). The PAG may include a material generating a relatively strong acid and having an acid dissociation constant (pKa) that is equal to or greater than about −20 and less than about 1. The PAG may include, for example, triarylsulfonium salts, diaryliodonium salts, sulfonates, a combination thereof, and/or the like. For example, the PAG may include triphenylsulfonium triflate, triphenylsulfonium antimonate, triphenylsulfonium difluoroalkyl sulfonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris (alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, norbornene-dicarboximide PFOS, a combination thereof, and/or the like.

In the photoresist composition, according to some embodiments of the inventive concepts, the PAG may be present in an amount of about 5 wt % to about 60 wt %, based on the total weight of the photosensitive polymer, but the inventive concepts are not limited thereto.

Solvent

The solvent included in the photoresist composition may include an organic solvent. The organic solvent may include, but is not limited to, at least one of ethers, alcohols, glycol ethers, aromatic hydrocarbon compounds, ketones, esters, a combination thereof, and/or the like. For example, the organic solvent may include ethylene glycol monomethyl ether, ethylene glycol monoethyl ether, methyl cellosolve acetate, ethyl cellosolve acetate, diethylene glycol methyl ether, diethylene glycol ethyl ether, propylene glycol, propylene glycol methyl ether (PGME), propylene glycol methyl ether acetate (PGMEA), propylene glycol ethyl ether, propylene glycol methyl ether acetate, propylene glycol propyl ether acetate, propylene glycol butyl ether, propylene glycol butyl ether acetate, ethanol, propanol, isopropyl alcohol, isobutyl alcohol, 4-methyl-2-pentanol (methyl isobutyl carbinol: MIBC), hexanol, 1-methoxy-2-propanol, 1-ethoxy-2-propanol, ethylene glycol, propylene glycol, heptanone, propylene carbonate, butylene carbonate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, gamma-butyrolactone, methyl 2-hydroxyisobutyrate, methoxybenzene, n-butyl acetate, 1-methoxy-2-propyl acetate, methoxyethoxy propionate, ethoxyethoxy propionate, a combination thereof, and/or the like.

In the photoresist composition according to some embodiments of the inventive concepts, the solvent may be present in a remaining amount excluding the amounts of main components (e.g., including the photosensitive polymer, the basic quencher, and/or the photoacid generator). In example embodiments, the solvent may be present in an amount of about 0.1 wt % to about 99.7 wt %, based on the total weight of the photoresist composition.

Quencher

The photoresist composition may further include a basic quencher.

The basic quencher may trap an acid in a non-exposed region of a photoresist film, when the acid generated from the PAG diffuses into the non-exposed region. Thus, after a photoresist film obtained from the photoresist composition is exposed to the stimulus, issues which may occur because of the acid generated in the exposed region of the photoresist film diffusing into a non-exposed region of the photoresist film may be mitigate and/or prevented.

In example embodiments, the basic quencher may include primary aliphatic amines, secondary aliphatic amines, tertiary aliphatic amines, aromatic amines, heterocyclic ring-containing amines, nitrogen-containing compounds having carboxyl groups, nitrogen-containing compounds having sulfonyl groups, nitrogen-containing compounds having hydroxyl groups, nitrogen-containing compounds having hydroxyphenyl groups, alcoholic nitrogen-containing compounds, amides, imides, carbamates, or ammonium salts. For example, the basic quencher may include, but is not limited to, triethanolamine, triethylamine, tributylamine, tripropylamine, hexamethyldisilazan, aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, a combination thereof, and/or the like.

In other example embodiments, the basic quencher may include a photo-decomposable base. The photo-decomposable base may include a compound generating an acid by exposure and neutralizing an acid before exposure. The photo-decomposable base may lose a function of trapping an acid when decomposed by exposure. Accordingly, when a certain region of a photoresist film formed of a chemically amplified photoresist composition, which includes the basic quencher including the photo-decomposable base, is exposed the photo-decomposable base in the exposed region of the photoresist film loses alkalinity, and the photo-decomposable base in a non-exposed region of the photoresist film traps an acid, thereby mitigating and/or preventing issues due to the acid generated in the exposed region of the photoresist film diffuses into the non-exposed region of the photoresist film from occurring.

The photo-decomposable base may include, for example, a carboxylate and/or sulfonate salt of a photo-decomposable cation. For example, the photo-decomposable cation may form a complex in company with an anion of a carboxylic acid having 1 to 20 carbon atoms. The carboxylic acid may include, for example, formic acid, acetic acid, propionic acid, tartaric acid, succinic acid, cyclohexylcarboxylic acid, benzoic acid, or salicylic acid, but is not limited thereto.

In the photoresist composition according to some embodiments of the inventive concepts, the basic quencher may be present in an amount of about 0.01 wt % to about 5.0 wt %, based on the total weight of the photoresist composition, but the inventive concepts are not limited thereto.

Other Components

In example embodiments, the photoresist composition may further include at least one of a surfactant, a dispersant, a moisture absorbent, or a coupling agent.

The surfactant may improve the coating uniformity and wettability of the photoresist composition. In some example embodiments, the surfactant may include, but is not limited to, a sulfuric acid ester salt, a sulfonic acid salt, phosphoric acid ester, soap, an amine salt, a quaternary ammonium salt, polyethylene glycol, an alkylphenol ethylene oxide adduct, a polyhydric alcohol, a nitrogen-containing vinyl polymer, a combination thereof, and/or the like. For example, the surfactant may include an alkylbenzene sulfonate, an alkyl pyridinium salt, polyethylene glycol, a quaternary ammonium salt, a combination thereof, and/or the like. When the photoresist composition includes the surfactant, the surfactant may be present in an amount of about 0.001 wt % to about 3 wt %, based on the total weight of the photoresist composition.

The dispersant may allow the respective components constituting the photoresist composition to be uniformly dispersed in the photoresist composition. In some example embodiments, the dispersant may include, but is not limited to, an epoxy resin, polyvinyl alcohol, polyvinyl butyral, polyvinylpyrrolidone, glucose, sodium dodecyl sulfate, sodium citrate, oleic acid, linoleic acid, a combination thereof, and/or the like. When the photoresist composition includes the dispersant, the dispersant may be present in an amount of about 0.001 wt % to about 5 wt %, based on the total weight of the photoresist composition.

The moisture absorbent may prevent adverse effects due to moisture in the photoresist composition. For example, the moisture absorbent may mitigate and/or prevent oxidation of the photoresist composition and/or a metal included in the photoresist composition. In some example embodiments, the moisture absorbent may include, but is not limited to, polyoxyethylene nonylphenol ether, polyethylene glycol, polypropylene glycol, polyacrylamide, a combination thereof, and/or the like. When the photoresist composition includes the moisture absorbent, the moisture absorbent may be present in an amount of about 0.001 wt % to about 10 wt %, based on the total weight of the photoresist composition.

The coupling agent may improve adhesion to a lower film when the photoresist composition is coated on the lower film. In some example embodiments, the coupling agent may include a silane coupling agent. The silane coupling agent may include, but is not limited to, vinyltrimethoxysilane, vinyltriethoxysilane, vinyltrichlorosilane, vinyltris(β-methoxyethoxy)silane, 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyldiethoxysilane, or trimethoxy[3-(phenylamino)propyl]silane, a combination thereof, and/or the like. When the photoresist composition includes the coupling agent, the coupling agent may be present in an amount of about 0.001 wt % to about 5 wt %, based on the total weight of the photoresist composition.

In the photoresist composition according to some embodiments, when the solvent includes only an organic solvent, the photoresist composition may further include water. In this case, water may be present in an amount of about 0.001 wt % to about 0.1 wt % in the photoresist composition.

Fabrication of Integrated Circuit Device

Next, a method of fabricating an integrated circuit device by using the photoresist composition according to the inventive concepts will be described by taking specific examples.

FIG. 1 is a flowchart illustrating a method of fabricating an integrated circuit device, according to embodiments of the inventive concepts. FIGS. 2A to 2E are cross-sectional views illustrating a sequence of processes of a method of fabricating an integrated circuit device, according to some embodiments of the inventive concepts.

Figure 2A:
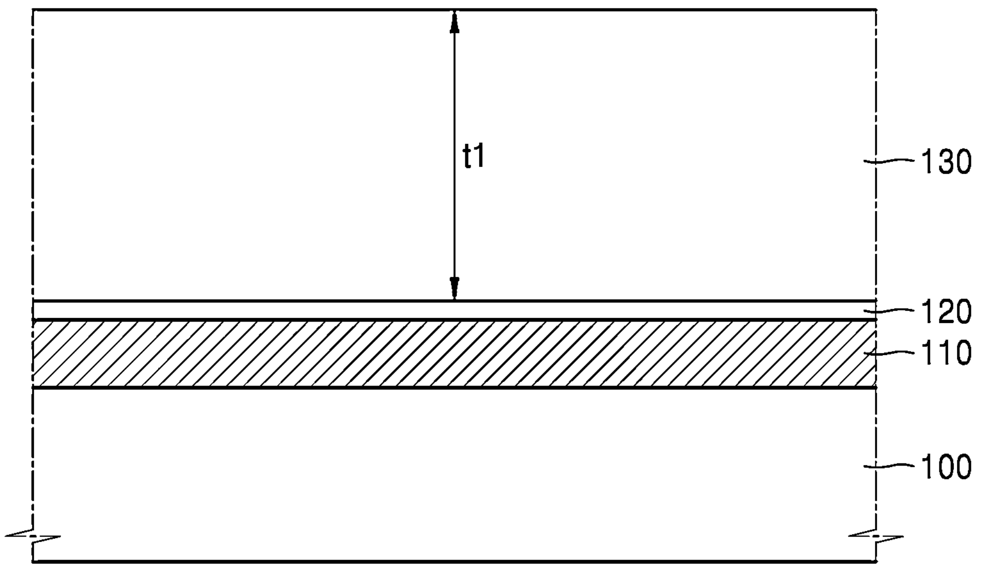
FIGS. 2A to 2E are cross-sectional views illustrating a sequence of processes of a method of fabricating an integrated circuit device, according to embodiments of the inventive concepts.

Referring to FIGS. 1 and 2A, in process P10, a feature layer 110 is formed on a substrate 100, and in process P20, a photoresist film 130 is formed to a first thickness t1 on the feature layer 110 using a photoresist composition. In some embodiments, the first thickness t1 of the photoresist film 130 may be tens to hundreds of nm.

The photoresist film 130 may include the photoresist composition according to the inventive concepts. A more detailed configuration of the photoresist composition is as described above.

The substrate 100 may include a semiconductor substrate. The feature layer 110 may include an insulating film, a conductive film, a semiconductor film, and/or a combination thereof. For example, the feature layer 110 may include, but is not limited to, a metal, an alloy, a metal carbide, a metal nitride, a metal oxynitride, a metal oxycarbide, a semiconductor, polysilicon, an oxide, a nitride, an oxynitride, a combination thereof, and/or the like.

In some example embodiments, as shown in FIG. 2A, before the photoresist film 130 is formed on the feature layer 110, a lower film 120 may be formed on the feature layer 110. In this case, the photoresist film 130 may be formed on the lower film 120. The lower film 120 may prevent the photoresist film 130 and the feature layer 100 from adversely affected each other. In some example embodiments, the lower film 120 may include an organic or inorganic anti-reflective coating (ARC) material for KrF excimer lasers, ArF excimer lasers, EUV lasers, and/or any other light sources. In example embodiments, the lower film 120 may include a bottom anti-reflective coating (BARC) film or a developable bottom anti-reflective coating (DBARC) film. In other example embodiments, the lower film 120 may include an organic component having a light absorption structure. The light absorption structure may include, for example, a hydrocarbon compound having a structure in which one or more benzene rings are fused. The lower film 120 may have, but is not limited to, a thickness of about 1 nm to about 100 nm. In example embodiments, the lower film 120 may be omitted.

To form the photoresist film 130, the photoresist composition according to the inventive concepts may be coated on the feature layer 110 and/or the lower film 120. The coating may be performed by a method, such as spin coating, spray coating, dip coating, and/or the like. The thickness t1 of the photoresist film 130 may be tens to hundreds of times the thickness of the lower film 120. The photoresist film 130 may have, but is not limited to, a thickness t1 of about 10 nm to about 1 μm.

In process P30, a first bake may be performed on the photoresist film 130. The first bake may be referred to as post-apply bake (PAB). Solvents included in the photoresist composition may be removed from the photoresist film 130 during the first bake.

The first bake may be performed at a temperature of about 80° C. to about 140° C. and/or about 90° C. to about 120° C. for about 10 seconds to about 100 seconds. When the temperature of the first bake is too low, the removal of the solvent may be insufficient. When the temperature of the first bake is too high, a resolution of a photoresist pattern may deteriorate.

Figure 2B:
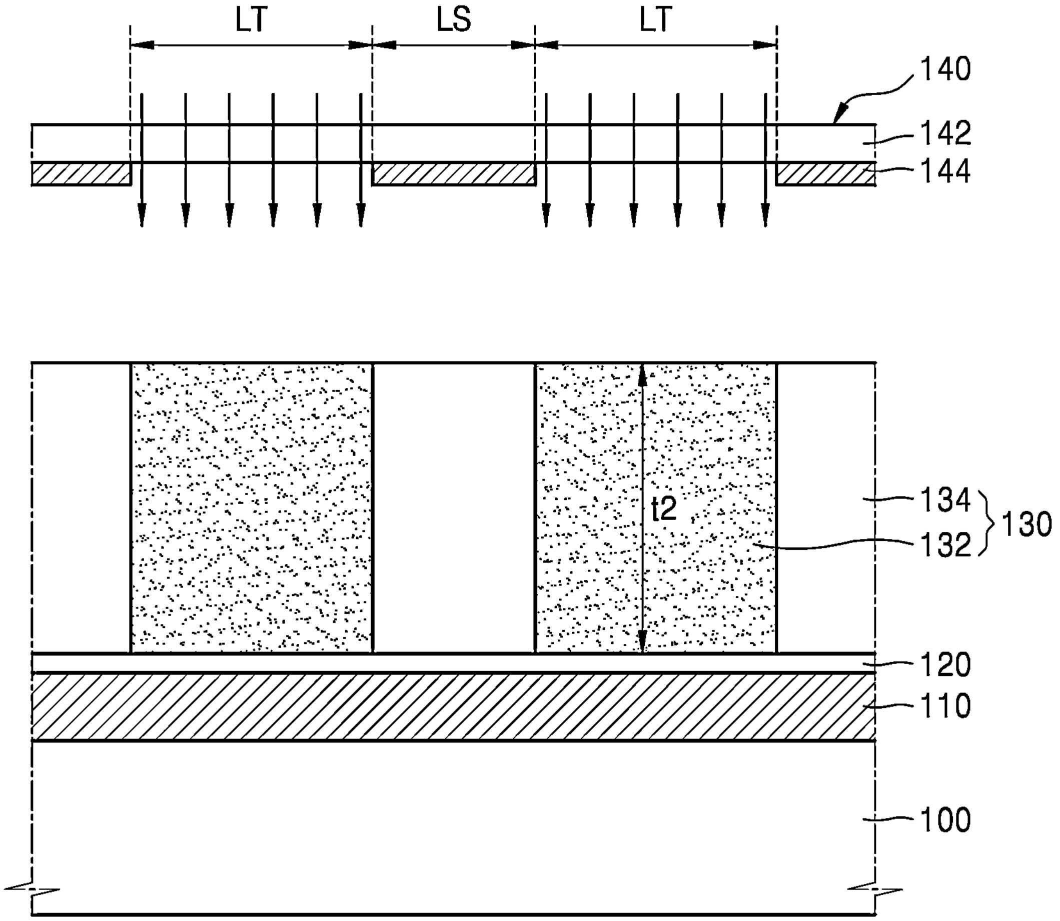

Referring to FIGS. 1 and 2B, in process P40, a first region 132, which is a portion of the photoresist film 130, is exposed, thereby generating an acid from the PAG in the photoresist composition in the first region 132. The PAG is the first repeating unit represented by Chemical Formula 1.

In some embodiments, the PAG may further include an independent ionic PAG that is separately added into the photoresist composition. For example, when sufficient sensitivity is not secured only by the first repeating unit included in the photosensitive polymer, an ionic PAG may be further added to the photoresist composition, and the amount thereof may be adjusted as needed.

In some example embodiments, to expose the first region 132 of the photoresist film 130, a photomask 140, which has a plurality of light shielding areas LS and a plurality of light transmitting areas LT, may be aligned at a certain position over the photoresist film 130, and the first region 132 of the photoresist film 130 may be exposed through the plurality of light transmitting areas LT of the photomask 140. To expose the first region 132 of the photoresist film 130, a KrF excimer laser (248 nm), an ArF excimer laser (193 nm), an F2 excimer laser (157 nm), or an EUV laser (13.5 nm) may be used. In some embodiments, a reflective photomask may be used instead of a transmissive photomask, according to the type of light source. Although descriptions will be made hereinafter by mainly taking an example using a transmissive photomask, it will be understood by those of ordinary skill in the art that the exposure may also be performed by an equivalent configuration by using a reflective photomask.

The photomask 140 may include a transparent substrate 142 and, on the transparent substrate 142, a plurality of light shielding patterns 144 formed in the plurality of light shielding areas LS. The transparent substrate 142 may include quartz. The plurality of light shielding patterns 144 may include chromium (Cr). The plurality of light transmitting areas LT may be defined by the plurality of light shielding patterns 144. According to the inventive concepts, to expose the first region 132 of the photoresist film 130, a reflective photomask (not shown) for EUV exposure may be used instead of the photomask 140.

Figure 3A:
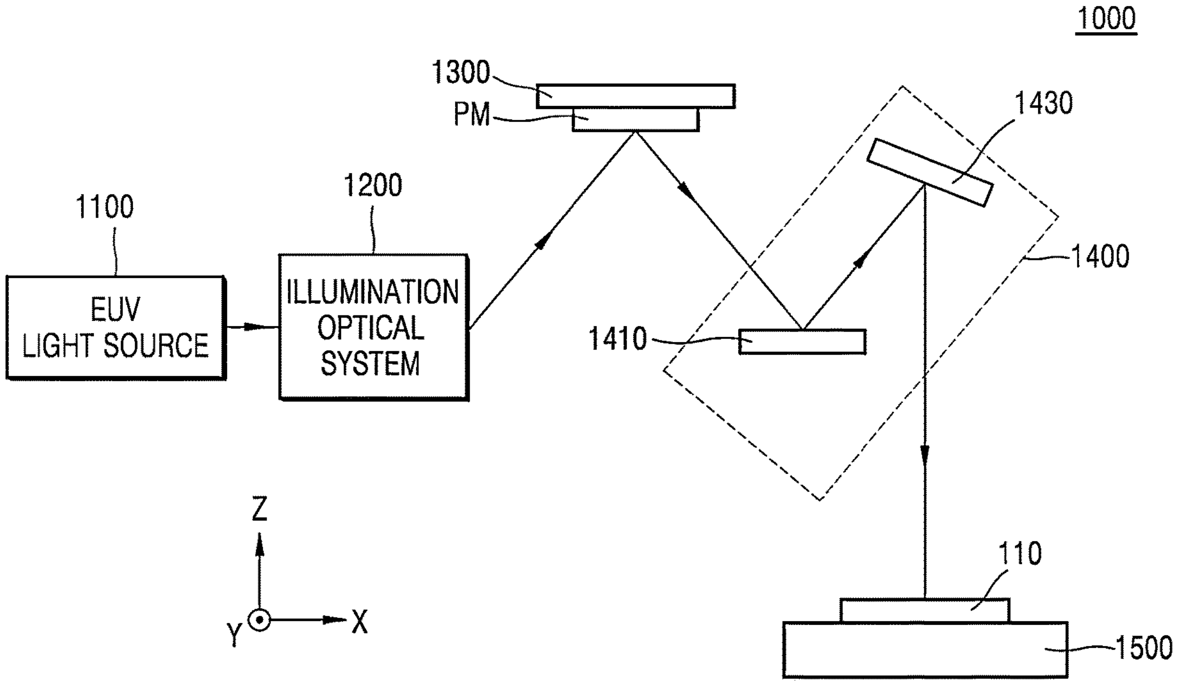
FIGS. 3A and 3B are schematic diagrams illustrating EUV exposure performed on a photoresist film on a feature layer.
Figure 3B:
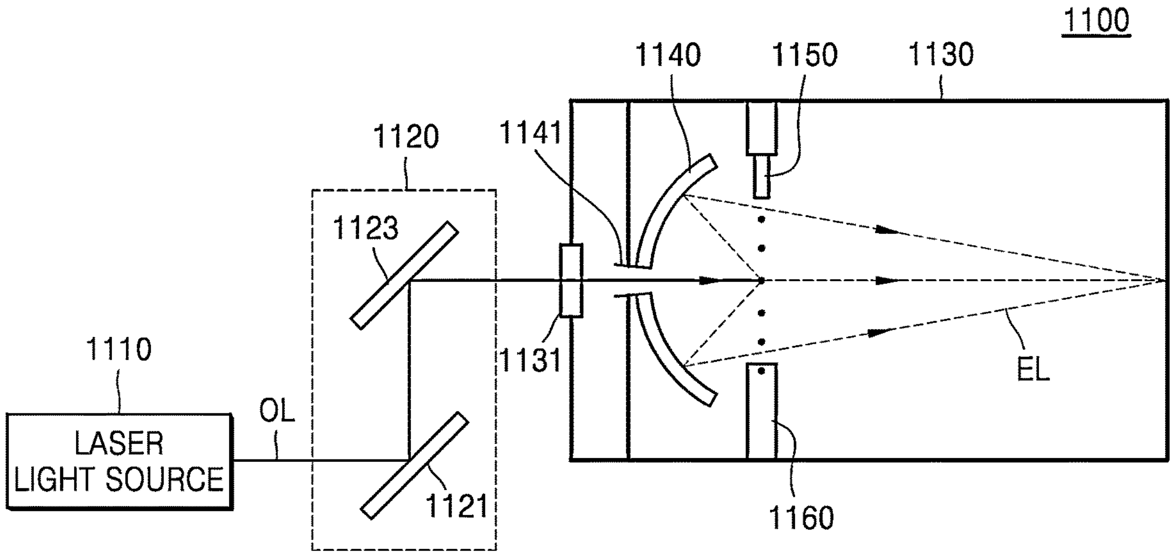

FIGS. 3A and 3B are schematic diagrams illustrating EUV exposure performed on the photoresist film 130 on the feature layer 110.

Referring together to FIGS. 3A and 3B, an EUV exposure device 1000 may include an EUV light source 1100, an illumination optical system 1200, a photomask support 1300, a projection optical system 1400, and a substrate stage 1500.

The EUV light source 1100 may generate and output EUV light EL having a high energy density. For example, the EUV light EL emitted from the EUV light source 1100 may have a wavelength of about 4 nm to about 124 nm. In some embodiments, the EUV light EL may have a wavelength of about 4 nm to about 20 nm, for example, a wavelength of 13.5 nm.

The EUV light source 1100 may be a plasma-based light source and/or a synchrotron radiation light source. Here, the plasma-based light source refers to a light source in which plasma is generated and light emitted by the plasma is used, and may include a laser produced plasma light source, a discharge produced plasma light source, and/or the like.

The EUV light source 1100 may include a laser light source 1110, a transfer optical system 1120, a vacuum chamber 1130, a collector mirror 1140, a droplet generator 1150, and a droplet catcher 1160.

The laser light source 1110 may be configured to output a laser beam OL. For example, the laser light source 1110 may output a carbon dioxide laser beam. The laser beam OL output from the laser light source 1110 may be incident on a window 1131 of the vacuum chamber 1130 through a plurality of reflective mirrors 1121 and 1123 included in the transfer optical system 1120, and be introduced into the vacuum chamber 1130.

An aperture 1141, through which the laser beam OL may pass, is formed in a central region of the collector mirror 1140, and the laser beam OL may be introduced into the vacuum chamber 1130 through the aperture 1141 of the collector mirror 1140.

The droplet generator 1150 may generate a droplet generating the EUV light EL, by interacting with the laser beam OL, and may provide the droplet into the vacuum chamber 1130. The droplet may include at least one of tin (Sn), lithium (Li), and xenon (Xe). For example, the droplet may include at least one of tin (Sn), a tin compound (for example, $SnBr_4$, $SnBr_2$, or SnH), a tin alloy (for example, Sn—Ga, Sn—In, or Sn—In—Ga), and/or the like.

The droplet catcher 1160 is located under the droplet generator 1150 and may be configured to collect droplets having not reacted with the laser beam OL. The droplets provided by the droplet generator 1150 may generate the EUV light EL by reacting with the laser beam OL introduced into the vacuum chamber 1130. The collector mirror 1140 may emit the EUV light EL to the illumination optical system 1200 arranged outside the vacuum chamber 1130, by collecting and reflecting the EUV light EL.

The illumination optical system 1200 may include a plurality of reflective mirrors and may transfer the EUV light EL, which is emitted from the EUV light source 1100, to an EUV photomask PM. For example, the EUV light EL emitted from the EUV light source 1100 may be reflected by a reflective mirror in the illumination optical system 1200 and be incident on the EUV photomask PM arranged on the photomask support 1300. In some example embodiments, the EUV photomask PM and/or the photomask support 1300 may be connected to a heatsink.

The EUV photomask PM may be a reflective mask including a reflective area and a non-reflective (or medium-reflective) area. The EUV photomask PM may include a reflective multilayer film, which is formed on a mask substrate formed of a material such as silicon (Si) having a low coefficient of thermal expansion, and an absorption pattern formed on the reflective multilayer film. Here, the reflective multilayer film may correspond to the reflective area, and the absorption pattern may correspond to the non-reflective (or medium-reflective) area.

The EUV photomask PM reflects the EUV light EL, which is incident through the illumination optical system 1200, and thus causes the EUV light EL to be incident on the projection optical system 1400. Specifically, the EUV photomask PM structuralizes light, which is incident from the illumination optical system 1200, into projection light, based on a pattern shape formed by the reflective multilayer film and the absorption pattern on the mask substrate, and causes the projection light to be incident on the projection optical system 1400. The projection light may be structuralized through a diffraction order of at least 2 due to the EUV photomask PM. The projection light may be incident on the projection optical system 1400 while having information about the pattern shape of the EUV photomask PM, and may form an image, which corresponds to the pattern shape of the EUV photomask PM, on a substrate 100 through the projection optical system 1400.

The projection optical system 1400 may include a plurality of reflective mirrors 1410 and 1430. Although two reflective mirrors 1410 and 1430 are shown in the projection optical system 1400 in FIG. 3A, this is for convenience of description, and the projection optical system 1400 may include more than two reflective mirrors. For example, the projection optical system 1400 may include 4 to 8 reflective mirrors. However, the number of reflective mirrors included in the projection optical system 1400 is not limited to the numerical values set forth above. The projection optical system 1400 may direct and/focus the projection light towards the substrate 100.

The substrate 100 may be arranged on the substrate stage 1500. The substrate stage 1500 may move in a first direction (X direction) and a second direction (Y direction) on an X-Y plane and may also move in a third direction (Z direction) that is perpendicular to the X-Y plane. By the movement of the substrate stage 1500, the substrate 100 may also move in the first direction (X direction), the second direction (Y direction), and/or the third direction (Z direction) in the same manner.

After the first region 132 of the photoresist film 130 is exposed according to process P40, the photoresist film 130 may undergo a second bake in process P50. The second bake may be referred to as post-exposure bake (PEB). The second bake may be performed at a temperature of about 50° C. to about 400° C. for about 10 seconds to about 100 seconds, but the inventive concepts are not limited thereto. In some example embodiments, during the second bake of the photoresist film 130, second repeating units of the photosensitive polymer in the first region 132 may be deprotected. Accordingly, a difference in solubility in a developer between the exposed first region 132 and the non-exposed second region 134 of the photoresist film 130 may be further increased.

In the exposure operation of process P40 and the PEB operation of process P50, the $—OR^1$ group of the first repeating unit of the photosensitive polymer is converted into a —OH group.

In addition, in the exposure operation of process P40 and the PEB operation of process P50, a separated protecting group, a reaction byproduct, and the like may outgas in a gaseous form and thus depart from the photoresist film 130. Accordingly, after the PEB operation of process P50, the exposed first region 132 may have a second thickness t2, and the second thickness t2 may be less than the first thickness t1. For example, although upper surfaces of the first region 132 and the second region 134 are shown as being flat at the same level in FIG. 2B, the photoresist film 130 may actually have a slightly concave upper surface in the first region 132.

Figure 2C:
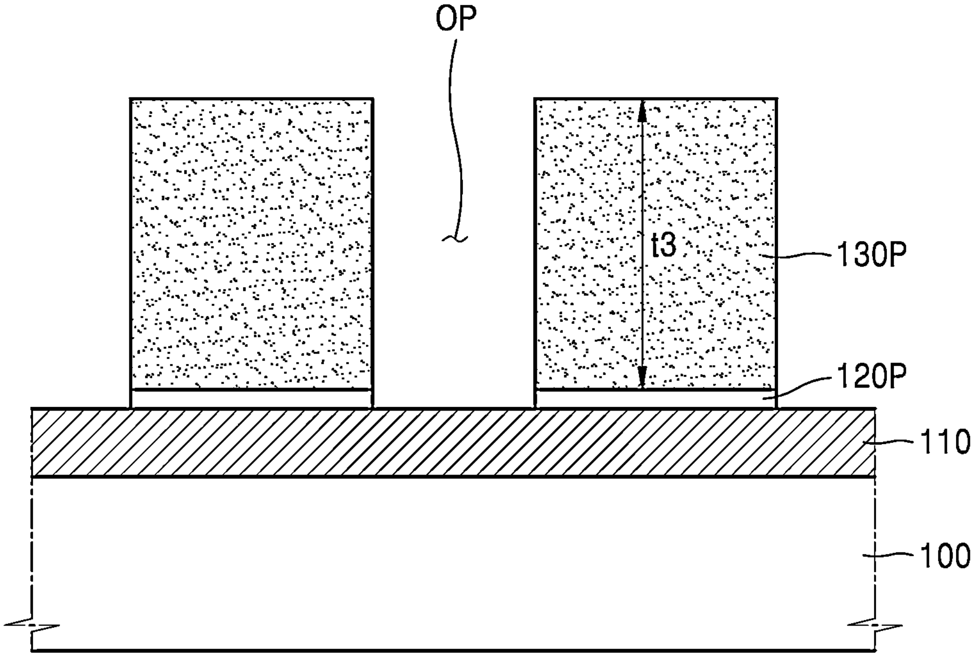

Referring to FIGS. 1 and 2C, in process P60, the second region 134 of the photoresist film 130 is removed by developing the photoresist film 130 by using a developer. As a result, a photoresist pattern 130P including the exposed first region 132 of the photoresist film 130 may be formed.

In some example embodiments, the development of the photoresist film 130 may be performed by a negative-tone development (NTD) process. Here, n-butyl acetate (nBA) and/or 2-heptanone may be used as the developer, but the developer is not limited thereto.

In other embodiments, the development of the photoresist film 130 may be performed by a positive-tone development (PTD) process. Here, an alkaline solution, for example, teramethylammonium hydroxide (TMAH), may be used as the developer, but the developer is not limited thereto.

Although the development of the photoresist film 130 is shown as being performed by an NTD process in FIG. 2C, it will be understood by those of ordinary skill in the art that the development of the photoresist film 130 may be performed by a PTD process, as needed.

As described with reference to FIG. 2B, along with the increasing difference in solubility in the developer between the exposed first region 132 and the non-exposed second region 134 in the photoresist film 130, the third thickness t3 of the photoresist film 130, which remains in the first region 132 without being removed while the second region 134 is removed by developing the photoresist film 130 in the process of FIG. 2C, increases. The remaining photoresist pattern 130P may have a third thickness t3, and the third thickness t3 may be less than the second thickness t2.

The photoresist pattern 130P may include a plurality of openings OP. After the photoresist pattern 130P is formed, a lower pattern 120P may be formed by removing portions of the lower film 120, which are exposed by the plurality of openings OP.

Figure 2D:
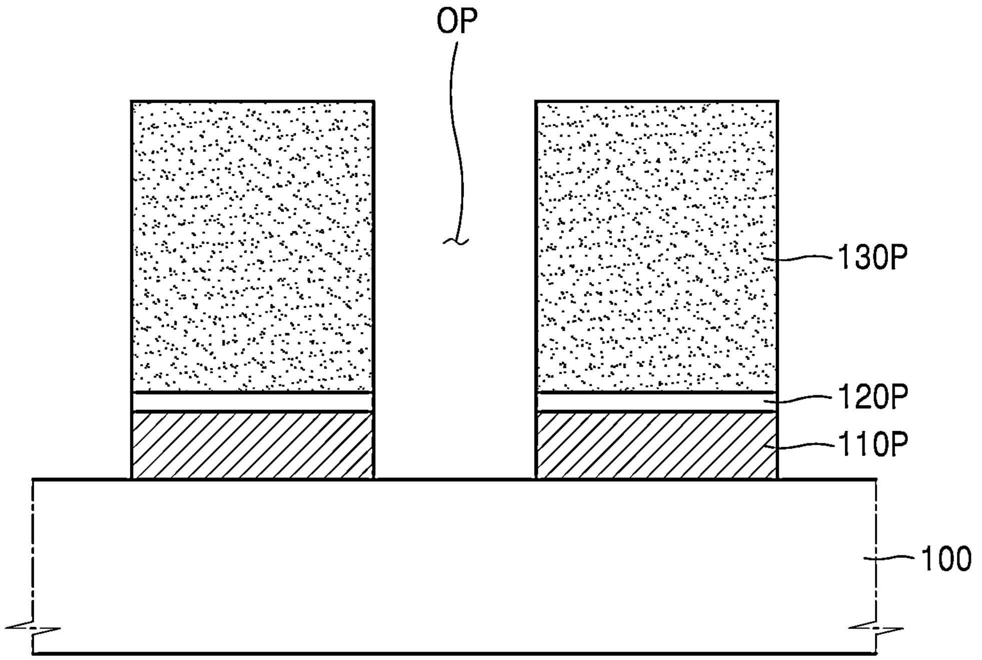

Referring to FIGS. 1 and 2D, in process P70, in a resulting product of FIG. 2C, the feature layer 110 is processed by using the photoresist pattern 130P.

To process the feature layer 110, various processes, such as a process of etching the feature layer 110 exposed by the openings OP of the photoresist pattern 130P, a process of implanting impurity ions into the feature layer 110, a process of forming an additional film on the feature layer 110 through the openings OP, and/or a process of modifying portions of the feature layer 110 through the openings OP, may be performed. FIG. 2D illustrates, as an example process of processing the feature layer 110, an example of forming a feature pattern 110P by etching the feature layer 110 exposed by the openings OP.

In other example embodiments, the process of forming the feature layer 110 may be omitted from the process described with reference to FIG. 2A, and in this case, instead of process P70 of FIG. 1 and the process described with reference to FIG. 2D, the substrate 100 may be processed by using the photoresist pattern 130P. For example, various processes, such as a process of etching a portion of the substrate 100 by using the photoresist pattern 130P, a process of implanting impurity ions into some regions of the substrate 100, a process of forming an additional film on the substrate 100 through the openings OP, and a process of modifying portions of the substrate 100 through the openings OP, may be performed.

Figure 2E:
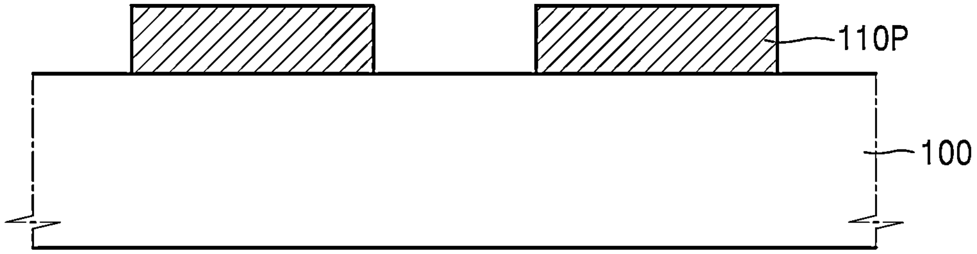

Referring to FIG. 2E, in a resulting product of FIG. 2D, the photoresist pattern 130P and the lower pattern 120P, which remain on the feature pattern 110P, may be removed. To remove the photoresist pattern 130P and the lower pattern 120P, ashing and strip processes may be used, but the example embodiments are not limited thereto.

The method of fabricating an integrated circuit device, which is described with reference to FIGS. 1 and 2A to 2E according to the inventive concepts, helps to obtain a better-quality pattern having improved LER and/or LWR. In addition, because a range of the amount of the ionic PAG, which may be added without the aggregation of the PAG increases, the required sensitivity of the photoresist film 130 may be more precisely controlled.

Hereinafter, although the inventive concepts are described in more detail with reference to specific examples and comparison examples, these examples are provided only for clearer understanding of the inventive concepts and are not to be construed in any way as limiting the scope of the inventive concepts.

Polymerization of Photosensitive Polymer

Example 1

Monomers respectively represented by Chemical Formulae E11, E2, and E3 and a catalytic amount of azobisisobutyronitrile (AIBN) were dissolved in 60 ml of dry tetrahydrofuran (THF) and then underwent degassing for 10 minutes under room-temperature Ar gas conditions. Here, a molar ratio of the monomers respectively represented by Chemical Formulae E11, E2, and E3 was adjusted such that the equivalence ratio thereof was 1:4:5.

(E11)

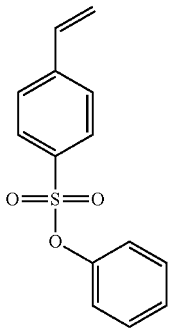

-continued (E2)

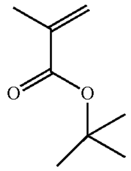

(E3)

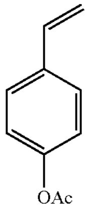

Next, the reaction mixture was reacted at 70° C. for 17 hours. Next, the reaction mixture was cooled down to room temperature and then quenched by exposing the reaction mixture to air. The produced polymer was precipitated under THF/hexane conditions, and the precipitate was dried for 12 hours in a vacuum oven, thereby obtaining a polymerization product in a white powder form.

The polymerization product was stirred for 6 hours in a mixed solution of sodium methoxide and methanol and then acidified by acetic acid. Next, a precipitate obtained by precipitating the polymerization product in distilled water was dried in a vacuum oven, thereby obtaining a polymer in a white powder form (31 g, yield of 67%).

The chemical formula of the produced photosensitive polymer includes a nonionic PAG as a repeating unit as in Chemical Formula E4, and the structure of the produced photosensitive polymer was checked by NMR spectroscopy.

[Chemical Formula E4]

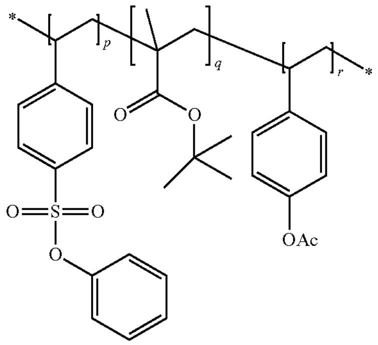

In Chemical Formula E4, p:q:r=1:4:5. $^{1}$H NMR: 7.73 (1H, br), 7.31 (0.5H, br), 7.47-7.61 (2H, m), 7.00-7.05 (6H, m), 6.74 (5H, br), 2.7 (2.5H, m), 2.86 (0.5H, m), 1.7-1.75 (5H, m), 1.50-1.64 (5H, m), 1.39 (6H, br), 1.28 (6H, br)

Examples 2 to 6

Photosensitive polymers were synthesized in the same manner as Example 1 except that monomers represented by Chemical Formulae E12 to E16 were used instead of the monomer represented by Chemical Formula E11, respectively.

-continued (E12)

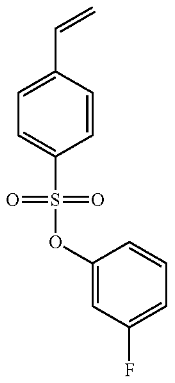

(E13)

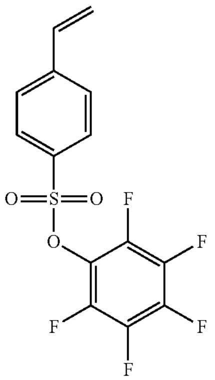

(E14)

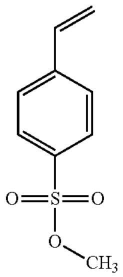

(E15)

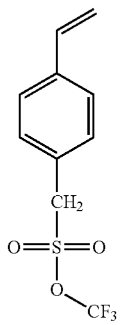

(E16)

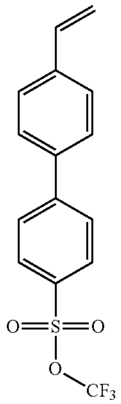

<Comparison Example>

A photosensitive polymer, which includes, as a repeating unit, an ionic PAG represented by Chemical Formula CE instead of the nonionic PAG of Examples 1 to 6, was synthesized.

[Chemical Formula CE]

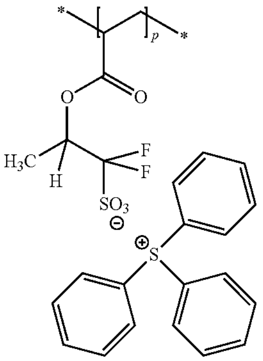

A photoresist composition was prepared by using each of the photosensitive polymers of Examples 1 to 6 and a Comparison Example. Each photoresist composition was prepared to include 20 wt % of a photoresist polymer, 3 wt % of triethylamine as a quencher, 2 wt % of polyethylene glycol as a surfactant, triphenylsulfonium difluoroalkyl sulfonate as an ionic PAG, and a balance of propylene glycol methyl ether as a solvent.

Aggregation Test

When each photoresist composition was prepared, it was observed whether the aggregation of the ionic PAG occurred in the photoresist composition while the amount of the ionic PAG was gradually increased, and results thereof are shown in Table 1.

TABLE 1

| | 5 wt % | 10 wt % | 15 wt % | 20 wt % | 25 wt % | 30 wt % | 50 wt % | 60 wt % | 70 wt % |
|---|---|---|---|---|---|---|---|---|---|
| Example 1 | X | X | X | X | X | X | X | O | O |
| Example 2 | X | X | X | X | X | X | X | X | O |
| Example 3 | X | X | X | X | X | X | X | O | O |
| Example 4 | X | X | X | X | X | X | X | X | O |
| Example 5 | X | X | X | X | X | X | X | O | O |
| Example 6 | X | X | X | X | X | X | X | O | O |
| Comparison Example | X | X | O | O | O | O | O | O | O |

In Table 1, the amount of the ionic PAG was represented by a percentage of the ionic PAG added based on the weight of the photosensitive polymer. In addition, X was given when the aggregation was not observed, and O was given when the aggregation was observed.

As shown in Table 1, the photoresist compositions respectively prepared by using the photosensitive polymers of Examples 1 to 6 did not suffer from the aggregation of the ionic PAG until the amount of the ionic PAG was 50 wt %. On the other hand, in the photoresist composition prepared by using the photosensitive polymer of the Comparison Example, the aggregation of the ionic PAG was observed when the amount of the ionic PAG was 15 wt % or more.

Therefore, when the photosensitive polymer according to some example embodiments of the inventive concepts is used, a possible range of the amount of the ionic PAG added to adjust the sensitivity of the photoresist composition more precisely is broad. As a result, the sensitivity of the photoresist composition may be more precisely adjusted, as needed.

Measurement of LER and LWR

Line and space patterns having a pitch size of 36 nm were formed on a silicon wafer by using each of the photosensitive polymers of Examples 1 to 6 and the Comparison Example and measured regarding LER and LWR, and results thereof are shown in Table 2.

TABLE 2

| | LER | LWR |
|---|---|---|
| Example 1 | 1.79 | 2.71 |
| Example 2 | 1.83 | 2.74 |
| Example 3 | 1.78 | 2.69 |
| Example 4 | 1.75 | 2.63 |
| Example 5 | 1.76 | 2.61 |
| Example 6 | 1.71 | 2.58 |
| Comparison Example | 1.91 | 2.82 |

As shown in Table 2, when the photosensitive polymers of Examples 1 to 6 were used, it can be confirmed that significantly improved LER and LWR may be achieved, as compared with use of the photosensitive polymer of the Comparison Example.

While the inventive concepts have been particularly shown and described with reference to embodiments thereof, it will be understood that various changes in form and details may be made therein without departing from the spirit and scope of the following claims.

What is claimed is:

1. An extreme ultraviolet (EUV) photosensitive polymer comprising:

a first repeating unit represented by Chemical Formula 1:

[Chemical Formula 1]

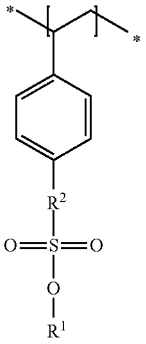

wherein, in Chemical Formula 1, $R^1$ is a C1 to C10 alkyl group, a C1 to C10 haloalkyl group, a C6 to C18 aryl group, a haloaryl group, a C7 to C18 arylalkyl group, a C7 to C18 alkylaryl group, or a C6 to C18 haloaryl group, $R^2$ is a direct bond, a C1 to C10 alkylene group, a C1 to C10 haloalkylene group, a C2 to C10 alkenyl group, a C2 to C10 alkynyl group, a C6 to C18 aryl group, a C7 to C18 arylalkyl group, or a C7 to C18 alkylaryl group, and the first repeating unit is 12% to 32% of a number of total repeating units;

a second repeating unit represented by Chemical Formula 2:

[Chemical Formula 2]

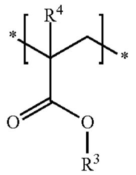

wherein, in Chemical Formula 2, $R^3$ is an acid-labile protecting group, $R^4$ is a hydrogen atom, a C1 to C6 linear or branched alkyl group, a halogen atom, or a C1 to C6 linear or branched alkyl halide group, and the second repeating unit is 25% to 65% of a number of total repeating units; and a third repeating unit represented by Chemical Formula 3:

[Chemical Formula 3]

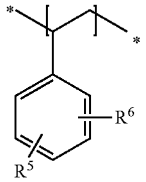

wherein, in Chemical Formula 3, $R^5$ is a hydrogen atom, a hydroxyl group, a carboxyl group, a C1 to C10 alkyl group, a C3 to C12 cycloalkyl group, or a C1 to C10 alkoxy group, and $R^6$ is a hydrogen atom, a hydroxyl group, or a carboxyl group, and the third repeating unit is 20% to 40% of a number of total repeating units.

2. The EUV photosensitive polymer of claim 1, wherein R1 is a methyl group, a monofluoromethyl group, a monochloromethyl group, a difluoromethyl group, a dichloromethyl group, a trifluoromethyl group, a trichloromethyl group, an ethyl group, a monofluoroethyl group, a monochloroethyl group, a difluoroethyl group, a dichloroethyl group, a trifluoroethyl group, a trichloroethyl group, a monofluorophenyl group, a monochlorophenyl group, a difluorophenyl group, a dichlorophenyl group, a trifluorophenyl group, a trichlorophenyl group, a tetrafluorophenyl group, a tetrachlorophenyl group, a perfluorophenyl group, or a perchlorophenyl group.

3. The EUV photosensitive polymer of claim 1, wherein $R^2$ is the direct bond or the C6 to C18 aryl group.

4. The EUV photosensitive polymer of claim 1, wherein the first repeating unit is represented by one of Chemical Formulae 1-1 to 1-8:

(1-1)

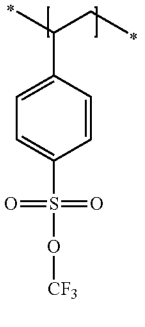

(1-2)

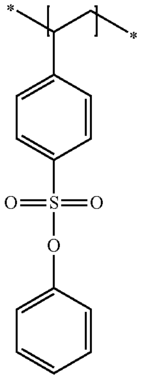

-continued (1-3)

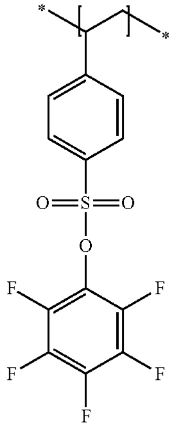

(1-4)

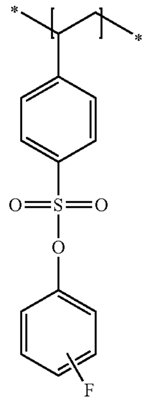

(1-5)

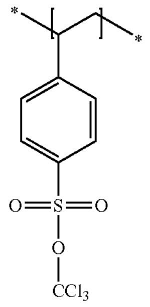

(1-6)

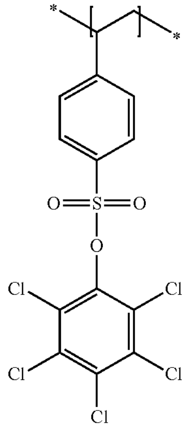

-continued (1-7)

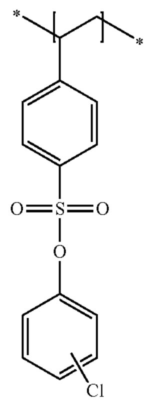

(1-8)

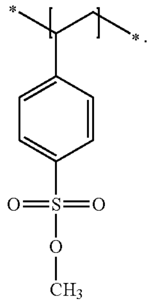

5. The EUV photosensitive polymer of claim 1, further comprising:

a fourth repeating unit represented by Chemical Formula 4:

[Chemical Formula 4]

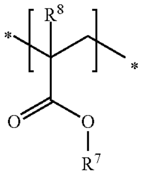

wherein, in Chemical Formula 4, $R^7$ is a C1 to C20 linear, branched, and/or cyclic saturated or unsaturated hydrocarbon group including 1 to 5 heteroatoms or including no heteroatom, and $R^8$ is a hydrogen, a C1 to C3 alkyl group, a C2 to C4 alkenyl group, a C2 to C4 alkynyl group, a C1 to C3 alkoxy group, a C6 to C10 aryl group, a C3 to C7 cycloalkyl group, or a C3 to C7 cycloalkenyl group.

6. A photoresist composition comprising:

a photosensitive polymer; and a solvent, wherein the photosensitive polymer comprises a first repeating unit represented by Chemical Formula 1:

[Chemical Formula 1]

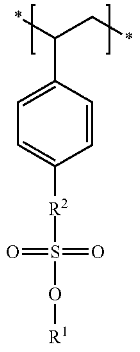

wherein, in Chemical Formula 1, $R^1$ is a C1 to C10 alkyl group, a C1 to C10 haloalkyl group, a C6 to C18 aryl group, a haloaryl group, a C7 to C18 arylalkyl group, a C7 to C18 alkylaryl group, or a C6 to C18 haloaryl group, $R^2$ is a direct bond, a C1 to C10 alkylene group, a C2 to C10 alkenyl group, a C2 to C10 alkynyl group, a C6 to C18 aryl group, a C7 to C18 arylalkyl group, or a C7 to C18 alkylaryl group), and the first repeating unit is 12% to 32% of a number of total repeating units a second repeating unit represented by Chemical Formula 2:

[Chemical Formula 2]

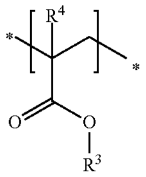

wherein, in Chemical Formula 2, $R^3$ is an acid-labile protecting group, $R^4$ is a hydrogen atom, a C1 to C6 linear or branched alkyl group, a halogen atom, or a C1 to C6 linear or branched alkyl halide group, and the second repeating unit is 25% to 65% of a number of total repeating units; and a third repeating unit represented by Chemical Formula 3:

[Chemical Formula 3]

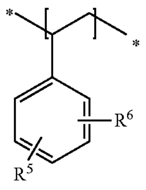

wherein, in Chemical Formula 3, $R^5$ is a hydrogen atom, a hydroxyl group, a carboxyl group, a C1 to C10 alkyl group, a C3 to C12 cycloalkyl group, or a C1 to C10 alkoxy group, and $R^6$ is a hydrogen atom, a hydroxyl group, or a carboxyl group, and the third repeating unit is 20% to 40% of a number of total repeating units.

7. The photoresist composition of claim 6, wherein $R^1$ is a methyl group, a monofluoromethyl group, a monochloromethyl group, a difluoromethyl group, a dichloromethyl group, a trifluoromethyl group, a trichloromethyl group, an ethyl group, a monofluoroethyl group, a monochloroethyl group, a difluoroethyl group, a dichloroethyl group, a trifluoroethyl group, a trichloroethyl group, a monofluorophenyl group, a monochlorophenyl group, a difluorophenyl group, a dichlorophenyl group, a trifluorophenyl group, a trichlorophenyl group, a tetrafluorophenyl group, a tetrachlorophenyl group, a perfluorophenyl group, or a perchlorophenyl group.

8. The photoresist composition of claim 6, wherein $R^2$ is the direct bond, a methylene group, or the C6 to C18 aryl group.

9. The photoresist composition of claim 6, wherein the first repeating unit is represented by one of Chemical Chemical Formulae 1-1 to 1-8:

(1-1)

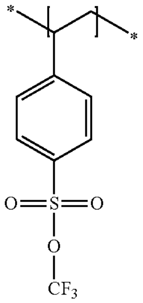

(1-2)

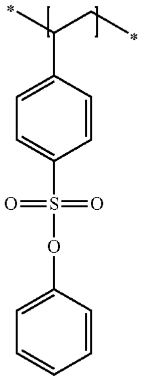

(1-3)

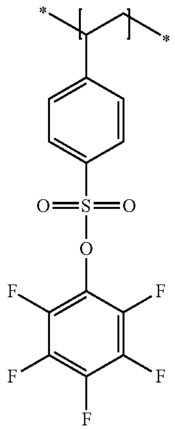

-continued (1-4)

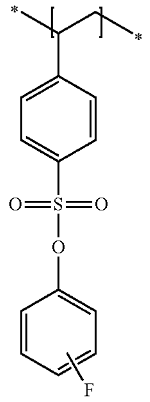

(1-5)

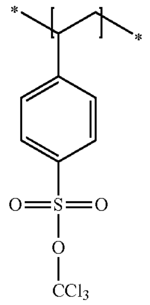

(1-6)

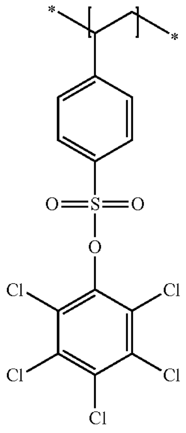

(1-7)

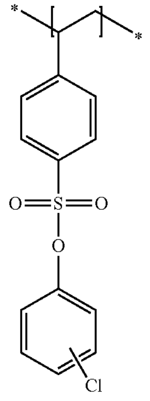

-continued (1-8)

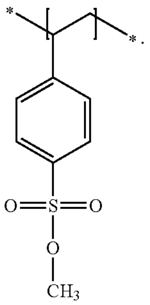

10. The photoresist composition of claim 6, further comprising: a photoacid generator (PAG).

11. The photoresist composition of claim 10, wherein the PAG is configured to generate an acid in response to irradiation by light having a wavelength of 13.5 nm.

12. The photoresist composition of claim 10, further comprising:

about 0.01 wt % to about 5 wt % of a basic quencher, based on a total weight of the photoresist composition.

13. The photoresist composition of claim 6, wherein $R^1$ is configured to dissociate from a $-SO_3$ group in response to irradiation by light having a wavelength of 13.5 nm.

14. A photoresist composition comprising:

a photosensitive polymer;

a photoacid generator (PAG);

a basic quencher; and a solvent, wherein the photosensitive polymer comprises a random copolymer comprising a first repeating unit represented by Chemical Formula 1, a second repeating unit represented by Chemical Formula 2, and a third repeating unit represented by Chemical Formula 3:

[Chemical Formula 1]

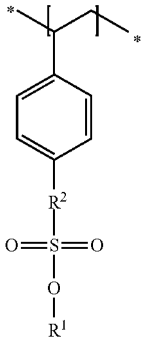

-continued

[Chemical Formula 2]

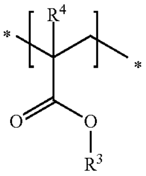

[Chemical Formula 3]

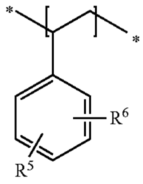

wherein in Chemical Formulae 1 to 3, $R^1$ is a C1 to C10 alkyl group, a C1 to C10 haloalkyl group, a C6 to C18 aryl group, a haloaryl group, a C7 to C18 arylalkyl group, a C7 to C18 alkylaryl group, or a C6 to C18 haloaryl group, $R^2$ is a direct bond, a C1 to C10 alkylene group, a C2 to C10 alkenyl group, a C2 to C10 alkynyl group, a C6 to C18 aryl group, a C7 to C18 arylalkyl group, or a C7 to C18 alkylaryl group, $R^3$ is an acid-labile protecting group, $R^4$ is a hydrogen atom, a C1 to C6 linear or branched alkyl group, a halogen atom, or a C1 to C6 linear or branched alkyl halide group, $R^5$ is a hydrogen atom, a hydroxyl group, a carboxyl group, a C1 to C10 alkyl group, a C3 to C12 cycloalkyl group, or a C1 to C10 alkoxy group, $R^6$ is a hydrogen atom, a hydroxyl group, or a carboxyl group, the first repeating unit is 12% to 32% of a total of the first, second, and third repeating units the second repeating unit is about 35% to about 65% of the total of the first, second, and third repeating units, and the third repeating unit is about 20% to about 40% of the total of the first, second, and third repeating units.

* * * * *